(12) United States Patent
Mayer et al.

(10) Patent No.: US 7,704,774 B2
(45) Date of Patent: Apr. 27, 2010

(54) PRESSURE SENSOR HAVING A CHAMBER AND A METHOD FOR FABRICATING THE SAME

(75) Inventors: Felix Mayer, Stäfa (CH); Johannes Bühler, Uster (CH); Matthias Streiff, Zürich (CH); Robert Sunier, Zürich (CH)

(73) Assignee: Sensirion Holding AG, Stafa (CH)

( * ) Notice: Subject to any disclaimer, the term of this patent is extended or adjusted under 35 U.S.C. 154(b) by 63 days.

(21) Appl. No.: 11/799,822

(22) Filed: May 3, 2007

(65) Prior Publication Data
US 2007/0275494 A1    Nov. 29, 2007

(30) Foreign Application Priority Data
May 23, 2006 (EP) .................. 06010606
Apr. 26, 2007 (EP) .................. 07008470

(51) Int. Cl.
*H01L 21/00* (2006.01)
(52) U.S. Cl. .................. 438/53; 257/E21.001
(58) Field of Classification Search .............. 438/48–53
See application file for complete search history.

(56) References Cited

U.S. PATENT DOCUMENTS

| | | | |
|---|---|---|---|
| 4,625,561 A | 12/1986 | Mikkor | |
| 4,949,581 A | 8/1990 | Rud, Jr. | |
| 4,975,390 A | 12/1990 | Fujii et al. | |
| 5,062,302 A | 11/1991 | Petersen et al. | |
| 5,113,868 A | 5/1992 | Wise et al. | |
| 5,155,061 A | 10/1992 | O'Conner et al. | |
| 5,277,068 A | 1/1994 | Fukiura et al. | |
| 5,332,469 A | 7/1994 | Mastrangelo | |
| 5,335,550 A | 8/1994 | Satou | |
| 5,343,064 A * | 8/1994 | Spangler et al. | ............. 257/350 |
| 5,407,501 A | 4/1995 | Koen et al. | |
| 5,470,797 A | 11/1995 | Mastrangelo | |
| 5,557,972 A | 9/1996 | Jacobs et al. | |
| 5,576,251 A | 11/1996 | Garabedian et al. | |
| 5,578,843 A | 11/1996 | Garabedian et al. | |

(Continued)

FOREIGN PATENT DOCUMENTS

DE     19929025     6/1999

(Continued)

OTHER PUBLICATIONS

"Silicon Fusion Bonding for Pressure Sensors", Kurt Petersen et al., NovaSensor; TH215-4/88/0000-01444, pp. 144-147.

(Continued)

*Primary Examiner*—Savitri Mulpuri
(74) *Attorney, Agent, or Firm*—Cooper & Dunham LLP

(57) ABSTRACT

A pressure sensor is manufactured by joining two wafers, the first wafer comprising CMOS circuitry and the second being an SOI wafer. A recess is formed in the top material layer of the first wafer, which is covered by the silicon layer of the second wafer to form a cavity. Part or all of the substrate of the second wafer is removed to forming a membrane from the silicon layer. Alternatively, the cavity can be formed in the second wafer. The second wafer is electrically connected to the circuitry on the first wafer. This design allows to use standard CMOS processes for integrating circuitry on the first wafer.

12 Claims, 5 Drawing Sheets

U.S. PATENT DOCUMENTS

| | | | |
|---|---|---|---|
| 5,683,594 | A | 11/1997 | Hocker et al. |
| 5,929,498 | A | 7/1999 | Ismail et al. |
| 5,936,164 | A | 8/1999 | Sparks et al. |
| 6,038,928 | A | 3/2000 | Maluf |
| 6,140,144 | A | 10/2000 | Najafi et al. |
| 6,143,583 | A | 11/2000 | Hays |
| 6,346,742 | B1 | 2/2002 | Bryzek et al. |
| 6,395,585 | B2 | 5/2002 | Branoll |
| 6,441,451 | B1 | 8/2002 | Ikeda et al. |
| 6,465,271 | B1 * | 10/2002 | Ko et al. .................. 438/48 |
| 6,499,354 | B1 | 12/2002 | Najafi et al. |
| 6,520,014 | B1 | 2/2003 | Brandl |
| 6,533,554 | B1 | 3/2003 | Vargo et al. |
| 6,556,418 | B2 | 4/2003 | Aiger et al. |
| 6,584,854 | B2 | 7/2003 | Kimura et al. |
| 6,700,174 | B1 | 3/2004 | Miu et al. |
| 6,713,828 | B1 | 3/2004 | Chavan et al. |
| 6,743,656 | B2 * | 6/2004 | Orcutt et al. ............... 438/66 |
| 6,777,263 | B1 | 8/2004 | Gan et al. |
| 6,973,835 | B2 | 12/2005 | Rangsten et al. |
| 7,015,060 | B1 * | 3/2006 | Kubena et al. ............. 438/50 |
| 7,273,763 | B1 | 9/2007 | Neumeier et al. |
| 7,482,193 | B2 * | 1/2009 | DCamp et al. ............. 438/51 |
| 2001/0023087 | A1 | 9/2001 | Brandl |
| 2003/0056598 | A1 | 3/2003 | Kimura et al. |
| 2003/0093895 | A1 | 5/2003 | Miyazaki et al. |
| 2003/0143775 | A1 | 7/2003 | Brady |
| 2004/0171195 | A1 | 9/2004 | Raben |
| 2005/0124159 | A1 | 6/2005 | Kalvesten et al. |
| 2005/0156320 | A1 | 7/2005 | Mastromatteo |
| 2005/0229711 | A1 | 10/2005 | Ohms et al. |
| 2006/0014358 | A1 | 1/2006 | Sawyer et al. |
| 2006/0027522 | A1 | 2/2006 | Martin et al. |
| 2006/0032039 | A1 | 2/2006 | Rangsten et al. |
| 2006/0063354 | A1 | 3/2006 | Fortin et al. |
| 2006/0097331 | A1 | 5/2006 | Hattori et al. |
| 2007/0141808 | A1 | 6/2007 | Fortin et al. |
| 2007/0275495 | A1 * | 11/2007 | Mayer et al. .................. 438/50 |

FOREIGN PATENT DOCUMENTS

| | | |
|---|---|---|
| DE | 10027234 | 12/2000 |
| DE | 10201054 | 1/2002 |
| EP | 0155517 | 9/1985 |
| EP | 0992778 | 4/2000 |
| EP | 1555517 | 7/2005 |
| WO | WO 36387 | 6/2000 |
| WO | WO03034016 | 4/2003 |
| WO | WO2004106879 | 12/2004 |
| WO | WO117198 | 10/2007 |

OTHER PUBLICATIONS

"Integrated Pressure Sensors on SOI", Jyrik Kiihamäki et al., Micro Structure Workshop 2004.

"Silicon Fusion Bonding and Deep Reactive Ion Etching; A New Technology From Microstructures", Erno H. Klaassen et al.; The 8$^{th}$ International Conference on Solid-State Sensors and Actuators, and Eurosensors IX. Stockholm, Sweden, Jun. 25-29, 1995.

U.S. Appl. No. 11/799,823, filed May 3, 2007, entitled "A Method for Fabricating a Pressure Sensor Using SOI Wafers", and which shares priority with the present application.

Examination Report of European Application No. 06010606.9.

H. Baltes et al., "CMOS-based Microsensors and Packaging", Sensors and Actuators, vol. 92, No. 1-3, pp. 1-9, Aug. 1, 2001.

* cited by examiner

PRESSURE SENSOR HAVING A CHAMBER AND A METHOD FOR FABRICATING THE SAME

CROSS REFERENCE TO RELATED APPLICATIONS

This application claims the priority of European patent application 06010606, filed May 23, 2006 and European patent application 07008470.2, filed Apr. 26, 2007, the disclosure of each of which are incorporated herein by reference in their entirety.

BACKGROUND OF THE INVENTION

The present invention relates to pressure sensors and methods for fabricating the same. Some aspects of the invention also relate to a method for fabricating a pressure sensor using a first and a second wafer, where the first wafer has circuitry integrated thereon and the second wafer comprises a handle substrate, a silicon layer and an insulation layer between the handle substrate and the silicon layer.

It has been known to manufacture a pressure sensor by joining a first wafer and a second wafer, where the first wafer has a recess that is covered by the second wafer. The second waver is an SOI (Silicon On Insulator) wafer, i.e. a wafer having a comparatively thick handle substrate of silicon, with a thin insulating layer arranged on top of the handle substrate and a thin silicon layer arranged over the insulating layer. The handle substrate is removed for forming a deformable membrane over the recess. The recess reaches into the silicon substrate of the first wafer. Such a design is poorly compatible with standard CMOS manufacturing processes and requires a number of additional, non-standard manufacturing steps that render it expensive.

BRIEF SUMMARY OF THE INVENTION

Hence, in a first aspect of the invention, it is an object of the present invention to provide a method that has higher compatibility with standard CMOS processes or bipolar processes.

According to this first aspect of the invention, the invention relates to a method for fabricating a pressure sensor comprising the steps of: providing a first wafer comprising a base substrate of silicon with integrated circuitry integrated thereon and at least one material layer deposited on said base substrate; providing a second wafer; manufacturing a recess in said first wafer by locally removing or omitting said material layer; mounting said second wafer, or a chip prepared from said second wafer, on said first wafer; and electrically connecting said second wafer to said circuitry on said first wafer; wherein said recess does not reach into said base substrate.

Accordingly, the second wafer is electrically connected to the circuitry integrated on the first wafer, which e.g. allows standard CMOS (or bipolar) circuitry on the first wafer to cooperate with one or more sensor elements formed by the second wafer. A recess is formed in the first wafer, which recess does extend through at least part of the material layers deposited onto the first wafer's base substrate but not into the base substrate itself, which allows to use standard CMOS or bipolar manufacturing processes.

This is in particular of importance if the recess if formed over a conducting layer, since that conducting layer can be manufactured using a CMOS or bipolar manufacturing process if the recess does not extend deeply into the base substrate. Similarly, any other structure at the bottom of such a recess can be manufactured using standard CMOS or bipolar manufacturing processes.

In an advantageous embodiment, the second wafer is applied as a whole to the first wafer. Alternatively, the second wafer can first be cut into individual chips, which are then applied to the first wafer.

In one advantageous embodiment, the second wafer comprises a cavity closed by the membrane. This obviates the need to form any recess in the substrate of the first wafer, thereby further improving compatibility with standard CMOS processes or bipolar processes.

As mentioned, the cavity is formed by a recess in the first wafer, but the recess only extends through a material layer (or several material layers) applied to the base substrate of the first wafer. The second wafer is mounted to the first wafer in such a manner that the silicon layer of the second wafer forms the deformable membrane over the recess. Hence, the recess can be formed by locally omitting or removing one or more material layers from the base substrate, a procedure which is again compatible with standard CMOS manufacturing processes. The material layer(s) can e.g. correspond to one or more of the layers typically applied in standard CMOS manufacturing processes, such as silicon oxide or silicon nitride layers, polysilicon layers or metal layers.

In a second aspect, it is an object of the invention to provide a sensor having good long term accuracy as well as a method for manufacturing the same.

In this second aspect, the invention relates to a method for fabricating a pressure sensor comprising the steps of: providing a first wafer comprising integrated circuitry thereon; providing a second wafer; mounting said second wafer, or a chip prepared from said second wafer, on said first wafer, thereby forming a cavity between said first and said second wafer; and applying a sealing layer to a seam between the first and the second wafer after joining them, thereby closing said seam.

Hence, the sensor is formed by mounting two wafers on top of each other, whereupon a sealing layer is applied to the seam between the wafers. This sealing layer closes the seam and prevents gas from passing through it.

The cavity can be a closed cavity (as used for an absolute pressure sensor) or an open cavity (connected to the bottom side of the first wafer in order to measure a pressure drop over the device.

In a third aspect, it is also an object of the invention to provide a pressure sensor having good long term accuracy.

In this third aspect, the invention relates to a method for fabricating a pressure sensor comprising the steps of: providing a first wafer comprising integrated circuitry thereon; providing a second wafer, mounting said second wafer, or a chip prepared from said second wafer, on said first wafer, thereby forming a cavity between said first and said second wafer; and after mounting said second wafer or said chip to said first wafer, evacuating said cavity through an opening.

Hence, again two wafers are mounted on top of each other and a cavity is formed therebetween. After mounting the wafers to each other, the cavity is evacuated through an opening. By providing such an opening and using it to evacuate the cavity only after mounting the wafers to each other, residual gases generated in the previous manufacturing steps can be removed from the cavity, thereby obtaining a better vacuum and cleaner conditions within the cavity.

In a fourth aspect, it is also an object of the invention to provide a pressure sensor having good long term accuracy.

In this fourth aspect, the invention relates to pressure sensor comprising at least one substrate formed from a wafer and a cavity covered by a deformable membrane, wherein said cavity comprises a first and a second chamber, wherein said first chamber has a smaller volume and height than said second chamber and wherein said membrane extends at least partially over said first chamber.

Hence, at least one substrate formed from a wafer is provided, as well as a cavity covered by a deformable membrane. The cavity has a first and a second chamber. The first chamber has a smaller volume and height than the second chamber, and the membrane extends at least partially over the first chamber. Hence, the first chamber can be used as an accurate measuring chamber, while the second chamber provides a better volume to surface ratio for the cavity, thereby reducing the partial pressure of residual gases within the cavity formed from atoms and molecules originating from the cavity's surfaces.

In a final aspect, the object of the invention is to provide a differential pressure sensor having good accuracy.

In this aspect, the invention relates to a differential pressure sensor comprising: a substrate; a chamber arranged at a first side of said substrate; a flexible membrane covering said chamber; and a through-hole connected to said chamber and extending through said substrate.

This allows to provide a shallow chamber, which is particularly suited for a capacitive measurement, as well as a connection to the environment at the opposite side of the substrate.

The term "pressure sensor" as used herein designates any type of sensor measuring a parameter that is equal to or derived from the pressure of a fluid. In particular, the term designates relative (i.e. differential) as well as absolute pressure sensors, it also covers static as well as dynamic pressure sensors, an important example of a dynamic pressure sensor being a microphone for detecting pressure oscillations in the range of some Hertz to some MHz. Typical examples of applications of such sensors are e.g. in scientific instrumentation, meteorology, altitude measurement, sound recording, etc.

BRIEF DESCRIPTION OF THE DRAWINGS

The invention will be better understood and objects other than those set forth above will become apparent when consideration is given to the following detailed description thereof. Such description makes reference to the annexed drawings, wherein.

DETAILED DESCRIPTION OF THE INVENTION

Figure 1:
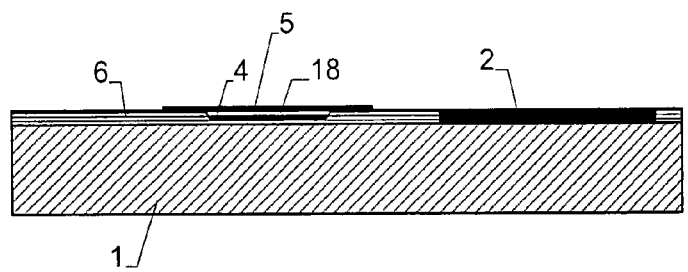
FIG. 1 shows a schematic sectional view of a pressure sensor with circuitry and recess in the first wafer.

The basic design of one embodiment of the pressure sensor according to the present invention is shown in FIG. 1. The sensor comprises a base substrate 1 of silicon with circuitry 2 integrated thereon. Circuitry 2 may e.g. comprise amplifiers, analog digital converters, analog and/or digital processing circuitry, interface circuits etc. Circuitry 2 can be of very simple design, e.g. comprising only a small number of transistors, or it can be complex and have a large number of transistors. Circuitry 2 is advantageously manufactured using a conventional CMOS manufacturing process.

Further, the sensor of FIG. 1 comprises a cavity 18 formed by a recess 4 covered by a membrane 5. In the shown embodiment, recess 4 is arranged in material layers 6 deposited on top of base substrate 1, namely the layers that have been applied to base substrate 1 in the course of the CMOS process used for creating circuitry 2.

FIGS. 2 to 6 illustrate the steps for a method to manufacture a pressure sensor. As described in more detail below, they substantially involve the formation of CMOS circuitry and a recess in a first wafer consisting of the base substrate and the material layers deposited thereon. The first wafer is subsequently joined to a second wafer, which is an SOI wafer having a handle substrate of silicon (on any other suitable material) with an insulating layer and a silicon layer deposited thereon. Finally, the second wafer is machined to form a membrane.

In a first step, CMOS circuitry 2 is applied to base substrate 1 of first wafer 1a using a conventional CMOS manufacturing process. This process comprises the application of various material layers, such as silicon dioxide layers 7, 8, 9 with polisilicon and/or metal layers 10a, 10b arranged therebetween. Typically, the layers are topped with a passivation layer 11 comprising silicon dioxide and/or silicon nitride.

Advantageously, passivation layer 11 in its turn is composed of two sublayers 11a, 11b, namely an SiN layer topped by an $SiO_2$ layer. The SiN layer serves as a barrier and protects the circuitry 2 in particular from water. The $SiO_2$ layer serves as a bonding surface for the components to be bonded to it, in particular the second wafer described below.

Figure 2:
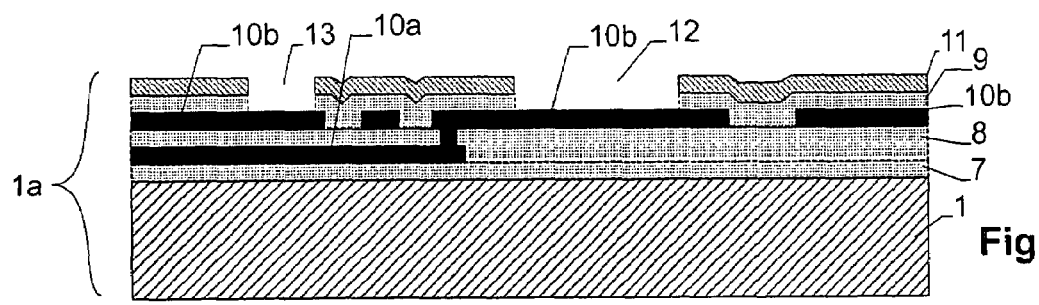
FIG. 2 depicts a first step in one embodiment of the present invention.

As can be seen in FIG. 2, a recess 12 is formed on the top surface (i.e. the surface receiving the circuitry 2). Recess 12 extends through part or all of the material layers 7-11, but not, or not necessarily, into base substrate 1. In the embodiment shown in FIG. 2, recess 12 extends through passivation layer 11 and topmost silicon dioxide layer 9. Recess 12 can be formed either by locally removing these layers 9, 11 using etching techniques or by locally omitting the layers 9, 11 using masking techniques. Recess 12 reaches down to topmost metal layer 10b. Forming this type of recess is part of the conventional CMOS manufacturing process and is e.g. used for creating contact windows.

In fact, a contact window 13 providing access to topmost metal layer 10b is also formed at a distance from recess 12.

Figure 3:
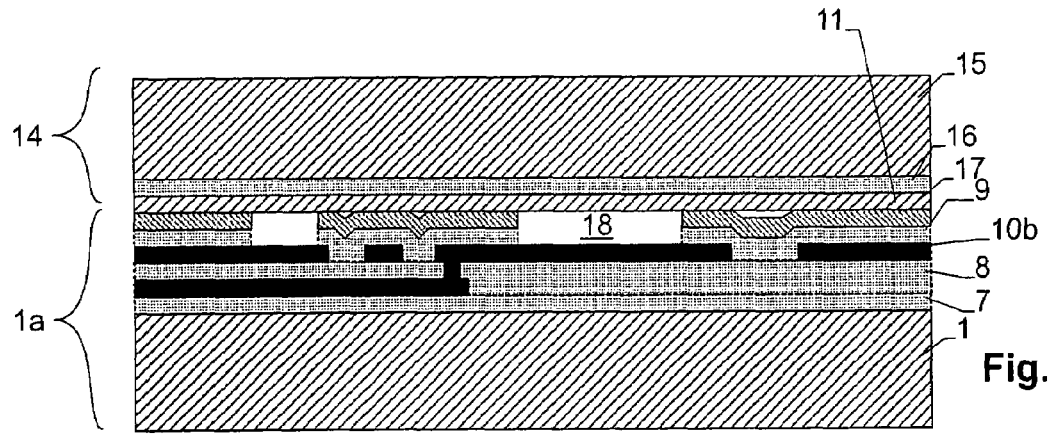
FIG. 3 depicts a second step in one embodiment of the present invention.

In a next step, as shown in FIG. 3, the second wafer 14 is applied to first wafer 1a. As mentioned, second wafer 14 comprises a handle substrate 15, advantageously of silicon, which carries an insulating layer 16 e.g. of silicon dioxide and a strongly doped silicon layer 17. Optionally, silicon layer 17 can be topped with a second dielectric layer for insulation and passivation.

Second wafer 14 is bonded to first wafer 1a in such a way that silicon layer 17 is facing first wafer 1a.

Figure 4:
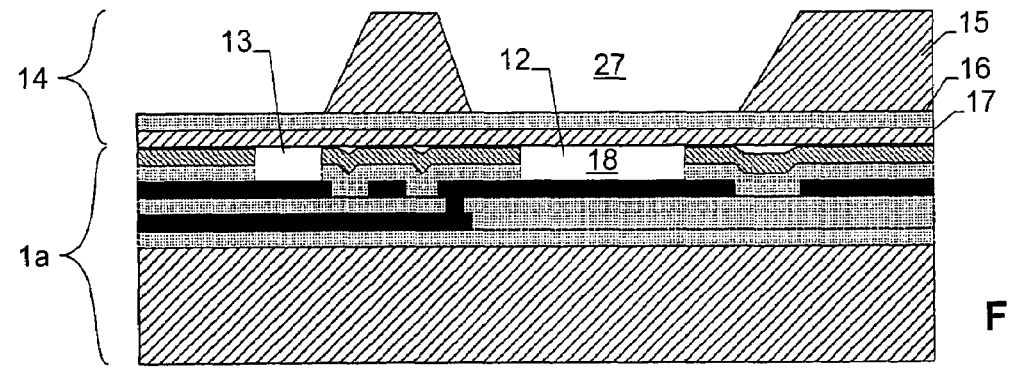
FIG. 4 depicts a third step in one embodiment of the present invention.

Now, and as shown in FIG. 4, part or all of handle substrate 15 is removed using a chemical etching process or a combination of mechanical milling and subsequent etching. In the embodiment of FIG. 4, a recess 27 is formed in handle substrate 15. Recess 27 reaches down to insulating layer 16. In addition to this, handle layer 15 is also removed above contact window 13.

Figure 5:
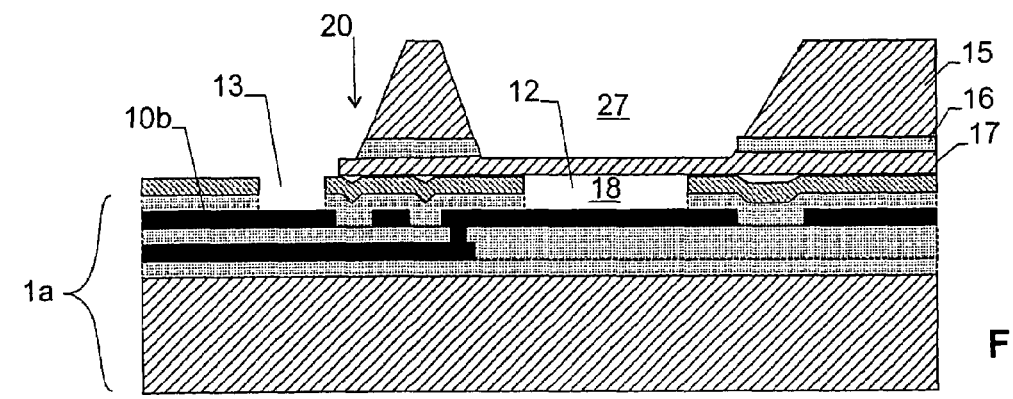
FIG. 5 depicts a fourth step in one embodiment of the present invention.

In a next step, as shown in FIG. 5, insulating layer 16 is removed in the area of recess 18 as well as above contact window 13, which leaves silicon layer 17 as a flexible membrane extending over and closing recess 12, thereby forming a cavity 18. Such a pure silicon membrane has high stability, predictable elastic properties and is substantially free of inherent stress.

Now silicon layer 17 is removed on top of contact window 13 thereby creating an access to topmost metal layer 10b. Contact window 13 is located at an edge 20 of second wafer 14.

Figure 6:
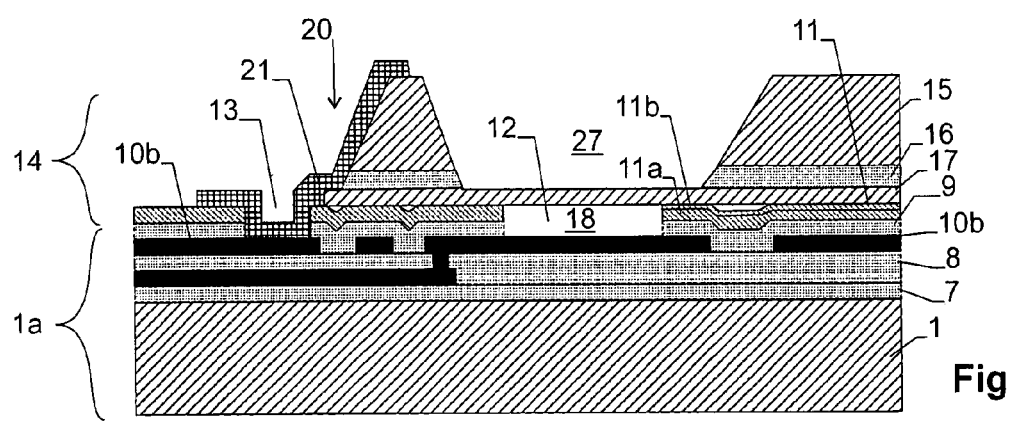
FIG. 6 depicts a fifth step in one embodiment of the present invention.
Figure 7:
FIG. 7 is a legend of the hatching patterns used in FIGS. 1-6 and 8ff.

As shown in FIG. 6, a wafer interconnect layer 21 is now applied to contact window 13 in first wafer 1a and to the edge 20 of second wafer 14. It generates an electrical contact between topmost metal layer 10b in the area of contact window 13, silicon layer 17 and handle substrate 15.

The resulting device shown in FIG. 6 has a hermetically sealed cavity 18 with a bottom electrode formed by topmost metal layer 10b and a top electrode formed by silicon layer 17. Wafer interconnect metal layer 21 allows to connect metal layer 10b and therefore the top electrode to the circuitry 2 on base substrate 1.

A change of pressure will lead to a deformation of the membrane formed by silicon layer 17 and therefore to a change of electrical capacitance between the two electrodes of cavity 18, which can be measured by circuitry 2.

Figure 8:
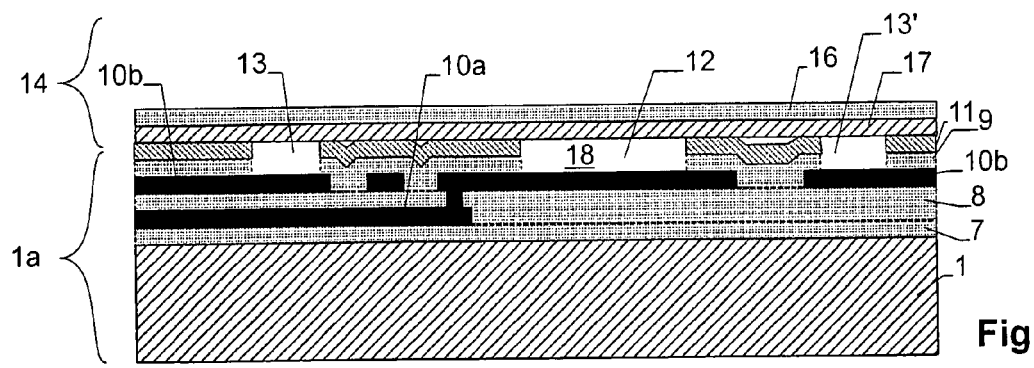
FIG. 8 shows a first step of a second embodiment of the present invention.
Figure 9:
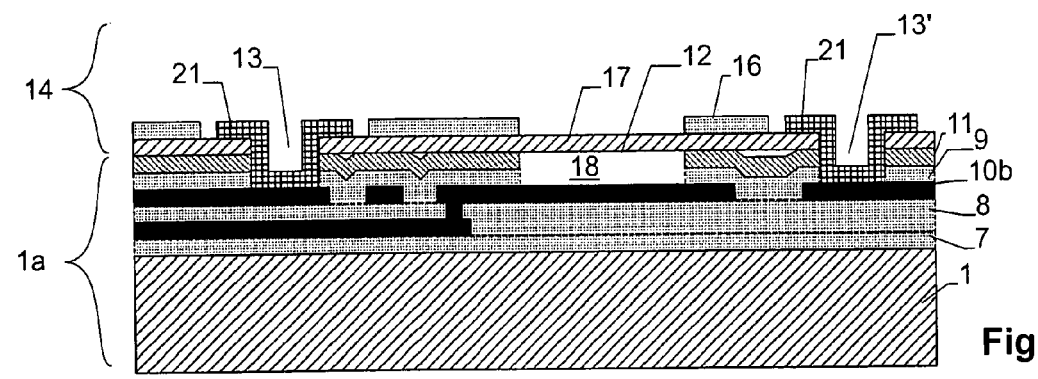
FIG. 9 shows a second step of the second embodiment of the present invention.

FIGS. 8 and 9 show an alternative embodiment of the present manufacturing process and device. The first steps of this process correspond to the steps shown in FIGS. 2 and 3. Now, however, all of handle substrate 15 is removed, as shown in FIG. 8, leaving only insulating layer 16 and silicon layer 17 of second wafer 14.

Subsequently, and as shown in FIG. 9, insulating layer 16 is removed over cavity 18 and contact window 13 as well as over a second contact window 13', and silicon layer 17 is removed over both contact windows 13, 13'. Now, wafer interconnect layer 21 can be applied at both contact windows 13, 13', thereby providing an electric contact between top metal layer 10b and silicon layer 17.

Figure 10:
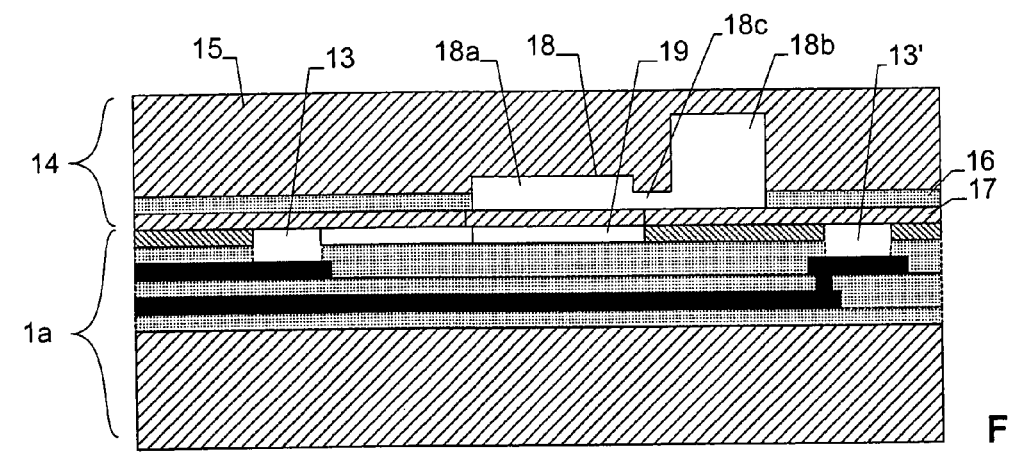
FIG. 10 shows a first step of a third embodiment of the present invention.
Figure 11:
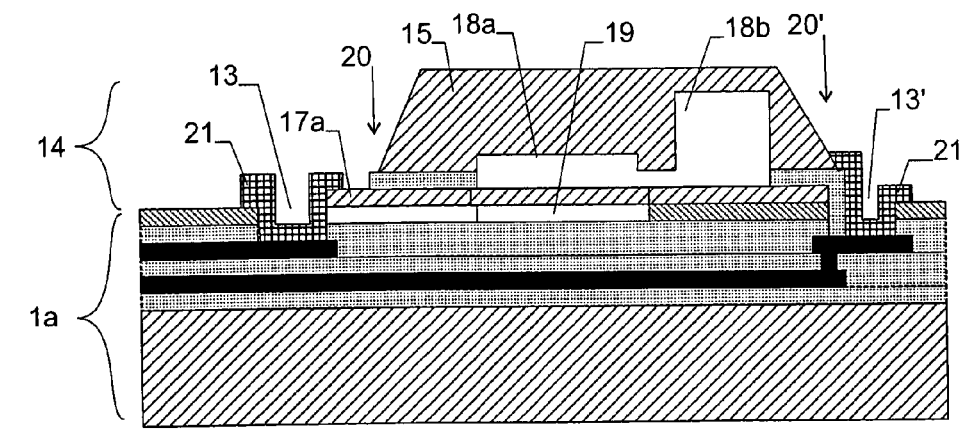
FIG. 11 shows a second step of the third embodiment of the present invention.

FIGS. 10 and 11 show a third embodiment. In this embodiment, the cavity 18 is formed in second wafer 14.

The process again starts with manufacturing circuitry 2 in first wafer 1a. At the same time, two contact windows 13, 13' are formed at the top surface thereof, as well as a recess 19.

In addition to this, second wafer 14 is prepared with a cavity 18 formed by a recess in handle wafer 15 covered by silicon layer 17. Methods for manufacturing such structures are known to the person skilled in the art and need not be described here.

Cavity 18 has a first chamber 18a and a second chamber 18b interconnected by a passage 18c. First chamber 18a has smaller height and smaller volume than second chamber 18b.

Second wafer 14 is bonded to first wafer 1a as shown in FIG. 10, with first chamber 18a being arranged over recess 19.

Now, as shown in FIG. 11, second wafer 14 is structured by removing part of handle substrate 15 such that it forms edges 20, 20', one of which is adjacent to contact window 13'. Insulating layer 16 is removed substantially everywhere except below the remaining part of handle substrate 15. Silicon layer 17 is etched off similarly, but extends at one end 17a to end adjacent to contact window 13. Now, wafer interconnect metal layers 21 are deposited at both contact windows 13, 13', connecting contact window 13 to silicon layer 17 and contact window 13' to handle substrate 15.

Albeit not visible in FIG. 11, recess 19 is laterally open to the environment, thereby exposing one side of the membrane formed by silicon layer 17 to ambient pressure.

In the embodiment of FIG. 11, chamber 18a is a capacitor with one electrode being formed by silicon layer 17 and the other electrode being formed by handle substrate 15. Chamber 18b, which has a much larger volume than chamber 18a, serves to improve the volume to surface ratio of cavity 18, thereby providing improved stability of the absolute pressure therein.

Figure 12:
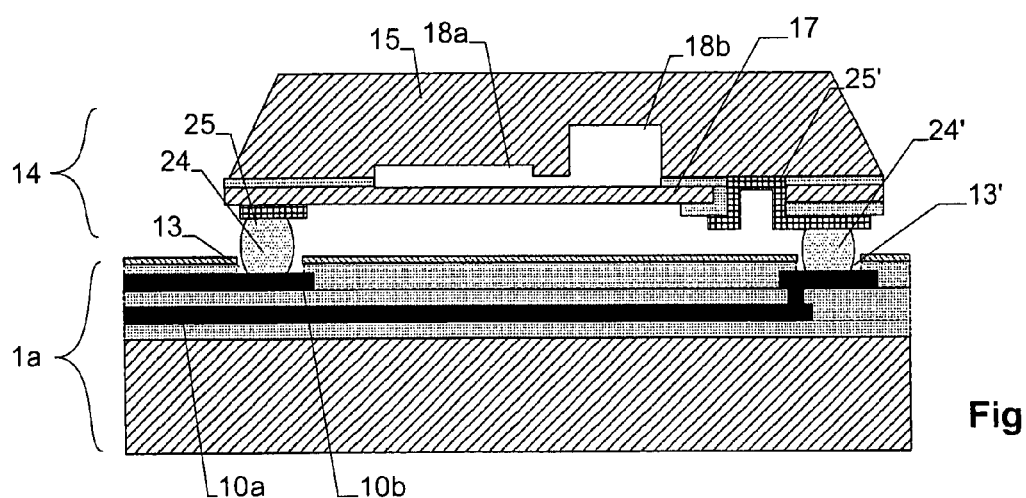
FIG. 12 shows a fourth embodiment of the present invention.

FIG. 12 shows an embodiment of the invention similar to the one of FIG. 11, but using a different method for contacting the two wafers. In the embodiment of FIG. 12, second wafer 14 is joined to first wafer 1a via metal bumps 24, 24'.

For this purpose, two contact windows 13, 13' are formed in first wafer 1a and a metal bump 24, 24' (or a bump of any other suited conducting material) is applied over each of them.

Matching the positions of the metal bumps 24, 24', two metal pads 25, 25' are arranged on second wafer 14, one of them contacting silicon layer 17, the other handle substrate 15. Then, second wafer 14 is placed on first wafer 1a such that the metal pads 25, 25' contact the metal bumps 24, 24'. This step may e.g. take place under elevated pressure or temperature for softening the metal bumps 24, 24', thereby creating reliable, mechanically stable contacts.

Alternatively, the metal bumps 24, 24' can first be applied to second wafer 14.

Instead of using metal bumps 24, 24', other conducting materials for creating suitably conducting connections are known to the person skilled in the art. In particular, anisotropically conducting glues can be used. Such glues contain conducting particles in a non-conducting matrix. When pressing the wafers against each other with the glue therebetween, the particles come into contact with each other and create conducting paths between the wafers.

Instead of applying the second wafer 14 as a whole to the first wafer 1a, it is possible to first cut (or etch) the second wafer into a plurality of individual chips, which then are applied to the first wafer 1a.

Figure 13:
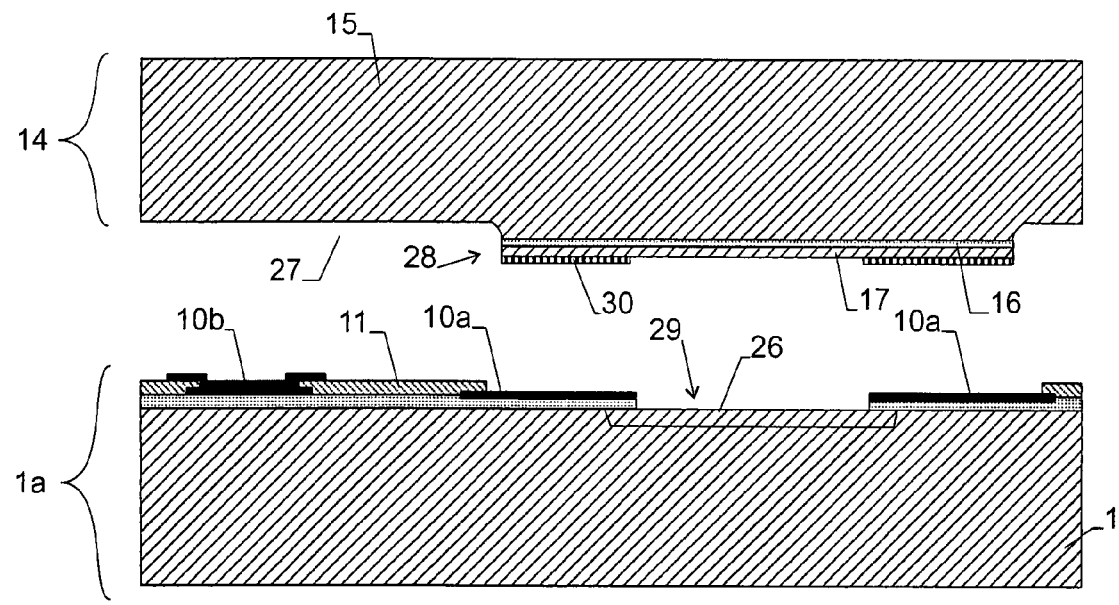
FIG. 13 shows a fifth embodiment of the present invention an intermediate manufacturing step.
Figure 14:
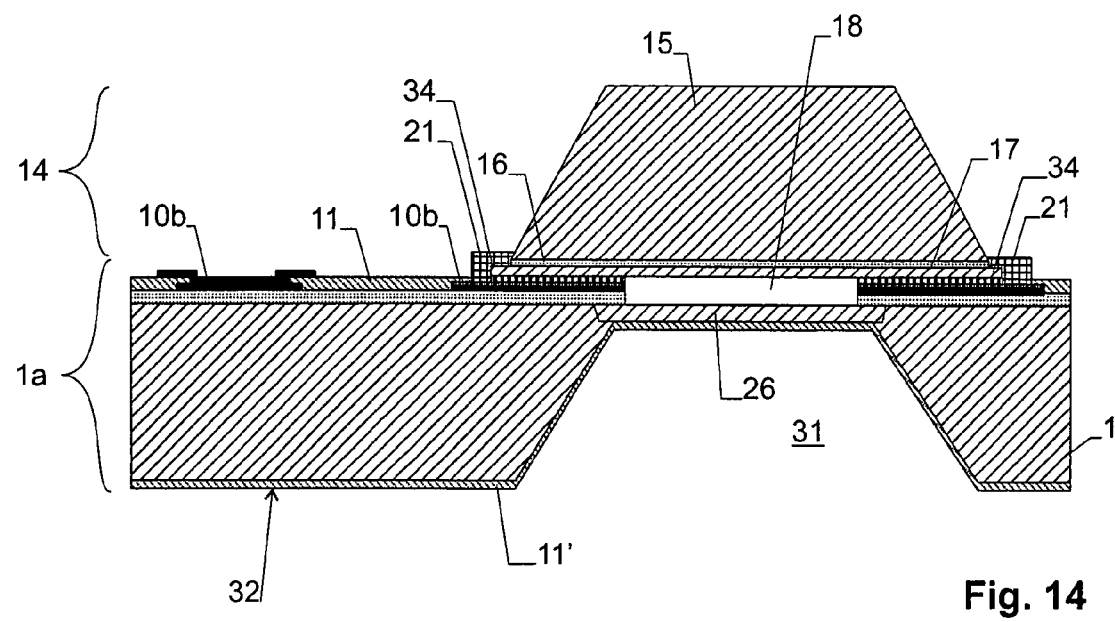
FIG. 14 shows the embodiment of FIG. 13 after assembly.

Yet another embodiment of the present invention is shown in FIGS. 13 and 14.

As shown in FIG. 13, base substrate is first provided with a strongly doped region 26 surrounded by a metal or polysilicon layer 10a. Strongly doped region 26 resides in a recess 29.

A suitable bonding layer 30, which may be a polymeric or metallic film, is affixed to second wafer 14 opposite to the metal or polysilicon layer 10a surrounding strongly doped region 26. Then, top layer 17, insulating layer 16 and part of the underlying handle substrate 15 of second wafer 14 are locally removed to form a recessed region 27, leaving a projecting region 28 opposite to strongly doped region 26.

Subsequently, second wafer 14 is bonded to first wafer 1a in the region of bonding layer 30 by methods known to the person skilled in the art. In this way, a cavity 18 is formed by former recess 29 above strongly doped region 26.

Handle substrate 15 is etched off everywhere except above the remaining top layer 17. Advantageously, patterning is chosen such that top layer 17 extends laterally beyond the remaining handle substrate 15, thereby forming projections 34.

A wafer interconnect layer 21 is then applied to form an electrical connection between the metal layers 10b and top layer 17 as well as substrate 15 of second wafer 14. Wafer interconnect layer 21 encloses the projections 34, thereby providing a stable and reliable connection.

In a next step, anisotropic etching is used to manufacture a recess 31 into base substrate 1 from the side 32 opposite to second wafer 14. Recess 31 reaches all through base substrate 1 to strongly doped region 26. Side 32 of base substrate 1 as well as the surfaces of recess 31 are then covered by a passivation layer 11'.

Hence, in this embodiment, strongly doped region 26 of base substrate 1 forms the flexible membrane between cavity 18 and recess 31 that is deformed depending on applied pressure. It forms one of the electrodes of a capacitor, the second electrode being formed by silicon layer 17 of second wafer 14. It must be noted that the embodiment of FIGS. 13 and 14 does not require second wafer 14 to be an SOI-wafer. Alternatively, second wafer 14 can be a conventional silicon wafer or a wafer of any other material.

The embodiment of FIGS. 13 and 14 has the advantage that the fluid whose pressure is to be measured can be applied to side 32 of first wafer 1a, i.e. to the side opposite to the integrated electronics and contact pads of the device, which makes it easier house the device in such a manner that the CMOS circuitry is protected against adverse environmental influences.

Instead of forming the recess 31 in first wafer 1a, material of first wafer 1a can be removed uniformly for thinning first wafer 1a until it is thin enough to form a flexible membrane closing cavity 18.

Figure 15:
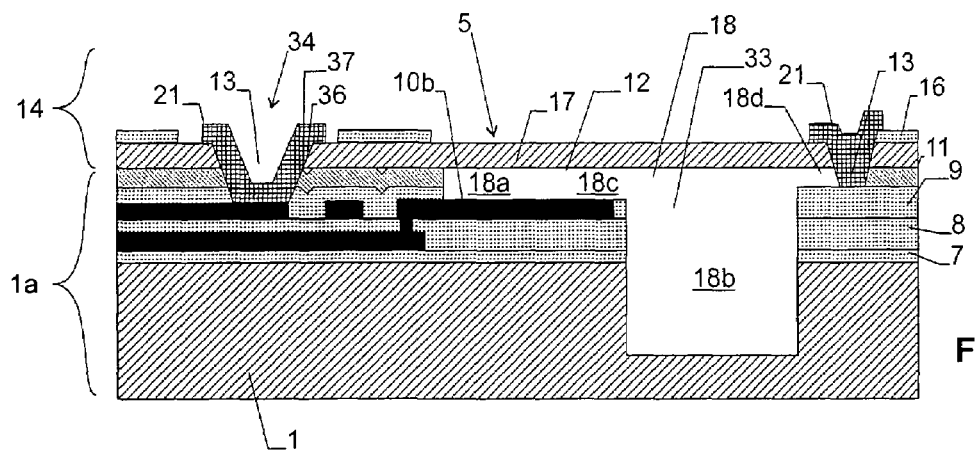
FIG. 15 shows a sixth embodiment of the present invention.
Figure 16:
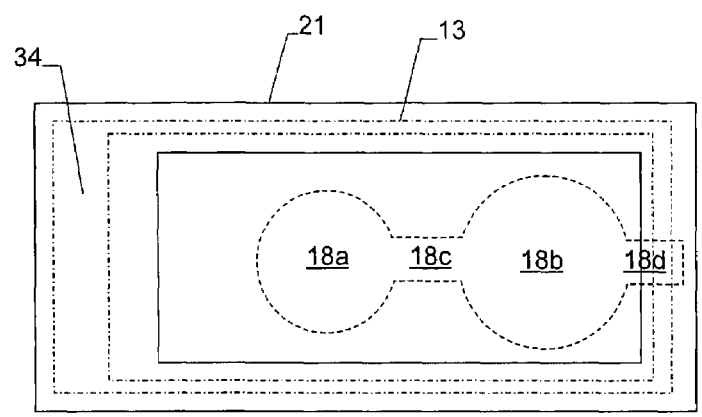
FIG. 16 shows part of the device of FIG. 15 from above.

Yet another embodiment of the invention is shown in FIGS. 15 and 16. This embodiment is similar to the one of FIG. 9, but cavity 18 in first wafer 1a comprises a first and a second chamber 18a, 18b, respectively, similar to the embodiment of FIG. 11. Again, the second chamber 18b has a much larger volume than the first chamber 18a and improves the vacuum quality in cavity 18. The two chambers 18a, 18b are interconnected by a passage 18c, which has substantially the same height as first chamber 18a, but smaller width, as depicted in FIG. 16.

The embodiments of FIGS. 11 and 15 both exhibit, as mentioned above, an improved stability of the pressure in cavity 18 since second chamber 18b provides a good volume to surface ratio of the cavity.

The deformable membrane 5 formed by conducting silicon layer 17 extends at least partially over the first chamber 18a. The first chamber 18a, which is shallow, forms a good measuring capacitor between the conducting layers 10b and 17, one of which conducting layers is located in the deformable membrane 5 and the other at the bottom of first chamber 18a.

Manufacturing of the embodiment of FIGS. 15 and 16 starts again by applying CMOS circuitry 2 to base substrate 1 of first wafer 1a using a conventional CMOS or bipolar manufacturing process.

The recess 12 that later forms first chamber 18a and passage 18c is again formed by locally removing the layers 9, 11 using etching techniques or by locally omitting the layers 9, 11 using masking techniques. In addition to recess 12, a much deeper pit or recess 33 is created, which will later form second chamber 18b. Recess 33 not only extends through the layers 9 and 11, but also into base substrate 1 of first wafer 1a. It is manufactured by anisotropic etching. Its depth is not a critical parameter and is defined by the etching conditions and etching duration.

The step of etching recess 33 is again fully compatible with the preceding CMOS or bipolar manufacturing steps if the CMOS circuitry and any other parts not to be etched are covered by a suitable protective layer as known to the person skilled in the art. Second chamber 18b is not used for a measurement, and it therefore does not require any electrode at its bottom.

After forming the recesses 12 and 33, second wafer 14 is applied to first wafer 1a, as above, and all of handle substrate 15 is removed.

Window 13 is formed in silicon layer 17 of second wafer 14. In contrast to the previous embodiments, window 13 is annular extends all around both cavities 18a, 18b, as shown in FIG. 16. The wafer interconnect layer 21 is applied over window 13.

The purpose of the annular window 13 and wafer interconnect layer 21 of the embodiment of FIG. 15 is two-fold. On the one hand, same as in the preceding embodiments, wafer interconnect layer 21 generates an electrical connection between silicon layer 17 and conducting layer 10b, namely in a region 34 where window 13 extends down to conducting layer 10b. On the other hand, wafer interconnect layer 21 forms a tight seal along the seam 37 between first wafer 1a and second wafer 14 around the cavities 18a, 18b, thereby preventing gas from entering (or leaving) the cavities through residual gaps between the two wafers 1a, 14.

A further advantageous feature of the embodiment of FIGS. 15 and 16 is the fact that, after mounting second wafer 14 to first wafer 1a, an opening is temporarily provided that connects cavity 18 to its surroundings. In the embodiment of FIGS. 15 and 16, this opening is formed by adding an auxiliary duct 18d to cavity 18, which connects cavity 18 to window 13. The opening (which is considered to be part of the seam 37) is used for a final vacuum evacuation of cavity 18 after joining second wafer 14 to first wafer 1a. After evacuation, the opening is closed. In the embodiment of FIG. 15, the opening is closed, together with the rest of seam 37, by means of wafer interconnect layer 21.

Instead of using a conducting layer (namely the metallic wafer interconnect layer 21) as a sealing layer for closing the opening and/or for providing a seal between first wafer 1a and second wafer 14 around cavity 18, a dielectric can be used as well, in particular glass, SiN, $SiO_2$ or diamond-like carbon (DLC).

In general, the sealing layer is applied to the seam 37 between the first and the second wafer after joining them. The whole seam 37 surrounding cavity 18 is covered by the sealing layer. Advantageously, this is achieved by applying the sealing layer to the edge of either the first or the second wafer (whichever is smaller) after joining the first and the second wafer. To improve the quality of the seal, the edge can be beveled, as shown by reference numeral 36 in FIG. 15.

To further improve long-time stability, the final device of any of the embodiments shown here can be covered by a passivation layer (not shown), e.g. of polyimide, SiN, Glass or DLC. The passivation layer can also act as sealing layer as described above.

Figure 17:
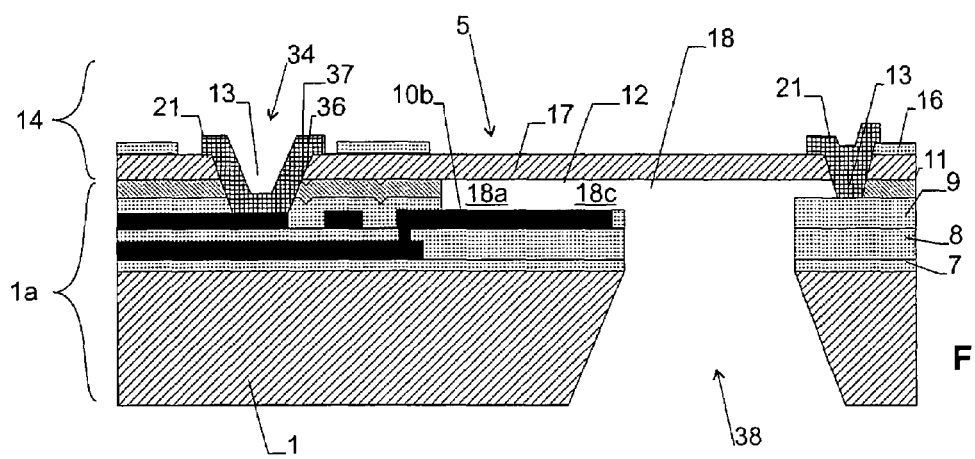
FIG. 17 shows a seventh embodiment of the present invention.

The techniques shown here can also be applied to a differential pressure sensor, such as shown in FIG. 17. This sensor is substantially designed in the same way as the one of FIG. 15, but second chamber 18b has been replaced by a through-hole 38 extending all the way through first wafer 1a, thereby providing the device with an "open" cavity 18.

The manufacturing process of the sensor of FIG. 17 is substantially the same as the one of FIG. 15, with the difference that the etching process for second chamber lasts until that chamber extends all through base substrate 1 for forming through-hole 38. Alternatively, anisotropic etching starting from the bottom side of base substrate 1 can be used.

In the embodiment of FIG. 17, the first chamber 18a is again located between two conducting layers 10b, 17 for forming a measuring capacitor. One of the conducting layers, namely silicon layer 17, is arranged in the flexible membrane 5 over the chamber, while the other conducting layer is arranged at the bottom of the chamber. The chamber is connected to the through-hole 38 arranged laterally beside it.

In the embodiments shown so far, there were two conducting layers 10a, 10b of metal in first wafer 1a. Depending on the CMOS (or bipolar) process to be used, this number may vary, and/or one or more of the conducting layers can be of silicon. Similarly, the number and composition of the insulating layers may vary.

While there are shown and described presently preferred embodiments of the invention, it is to be distinctly understood that the invention is not limited thereto but may be otherwise variously embodied and practised within the scope of the following claims.

The invention claimed is:

1. A method for fabricating a pressure sensor comprising:
providing a first wafer comprising a base substrate of silicon with integrated circuitry integrated thereon and at least one material layer deposited on said base substrate;
providing a second wafer;
manufacturing a recess in said first wafer by locally removing or omitting said material layer; and
mounting said second wafer, or a chip prepared from said second wafer, on said first wafer, and electrically connecting said second wafer to said circuitry on said first wafer,
wherein said recess does not reach into said base substrate, and wherein said second wafer comprises a handle substrate, a silicon layer and an insulating layer between said handle substrate and said silicon layer, said silicon layer being positioned to form at least part of a deformable membrane over said recess for sensing a pressure, said second wafer comprising a cavity closed by said deformable membrane.

2. The method of claim 1 comprising the steps of forming a first electrical contact between said circuitry and said handle substrate and a second electrical contact between said circuitry and said membrane.

3. The method of claim 1 comprising the step of forming said cavity at least partially by forming a recess in said handle substrate.

4. The method of claim 1 wherein said cavity comprises a first chamber and a second chamber, the first chamber having smaller volume and smaller height than the second chamber, wherein said deformable membrane covers said first chamber.

5. The method of claim 1 wherein said material layer is a silicon oxide, silicon nitride, metal or polisilicon layer.

6. The method of claim 5 wherein said recess is formed over a conducting layer, in particular a metal layer on said first wafer.

7. A method for fabricating a pressure sensor comprising:
providing a first wafer comprising a base substrate of silicon with integrated circuitry integrated thereon and at least one material layer deposited on said base substrate;
providing a second wafer;
manufacturing a recess in said first wafer by locally removing or omitting said material layer;
mounting said second wafer, or a chip prepared from said second wafer, on said first wafer, and electrically connecting said second wafer to said circuitry on said first wafer;
preparing a contact window on said first wafer;
forming or placing an edge of said second wafer at said contact window; and
applying a metal layer contacting said contact window to said edge, wherein said recess does not reach into said base substrate, said second wafer comprising a silicon layer positioned to form at least part of a deformable membrane over said recess for sensing a pressure, said second wafer comprising a cavity closed by said deformable membrane.

8. The method of claim 1 wherein said integrated circuitry is manufactured using a CMOS process or a bipolar process.

9. The method of claim 1 further comprising the steps of forming a cavity between said first and said second wafer, removing material from said first wafer from a side opposite to said second wafer with a membrane formed by said first wafer remaining for closing said cavity.

10. The method of claim 9 wherein a passivation layer is applied from said second side to said first wafer.

11. A method for fabricating a pressure sensor comprising:
providing a first wafer comprising a base substrate of silicon with integrated circuitry integrated thereon and at least one material layer deposited on said base substrate;
providing a second wafer;
manufacturing a recess in said first wafer by locally removing or omitting said material layer;
mounting said second wafer, or a chip prepared from said second wafer, on said first wafer, and electrically connecting said second wafer to said circuitry on said first wafer;
forming a cavity between said first and said second wafer;
removing material from said first wafer from a side opposite to said second wafer with a membrane formed by said first wafer remaining for closing said cavity, wherein said recess does not reach into said base substrate; and
locally etching off part of said second wafer, wherein said second wafer comprises a silicon top layer, an insulating layer and a handle substrate with the insulating layer being arranged between said top layer and said handle substrate, and, wherein said second wafer is locally etched off thus that top layer extends laterally beyond handle substrate, thereby forming projections, which projections are then enclosed by a wafer interconnect layer.

12. A method for fabricating a pressure sensor comprising:
providing a first wafer comprising a base substrate of silicon with integrated circuitry integrated thereon and at least one material layer deposited on said base substrate;
providing a second wafer;
manufacturing a recess in said first wafer by locally removing or omitting said material layer;
mounting said second wafer, or a chip prepared from said second wafer, on said first wafer, and electrically connecting said second wafer to said circuitry on said first wafer;

forming a cavity between said first and said second wafer;
removing material from said first wafer from a side opposite to said second wafer with a membrane formed by said first wafer remaining for closing said cavity, wherein said recess does not reach into said base substrate; and forming a recess in said first wafer from a side opposite to said second wafer into said first wafer, with said membrane remaining between said cavity and said recess.

* * * * *